(12) United States Patent
Kaltner et al.

(10) Patent No.: US 9,166,581 B2
(45) Date of Patent: Oct. 20, 2015

(54) ELECTRODE DEVICE, CIRCUIT ARRANGEMENT AND METHOD FOR THE APPROACH AND TOUCH DETECTION

(75) Inventors: Claus Kaltner, Bergkirchen (DE); Reinhard Unterreitmayer, Gauting (DE); Holger Steffens, München (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 346 days.

(21) Appl. No.: 13/637,131

(22) PCT Filed: Mar. 24, 2011

(86) PCT No.: PCT/EP2011/054573
§ 371 (c)(1),
(2), (4) Date: Mar. 18, 2013

(87) PCT Pub. No.: WO2011/117369
PCT Pub. Date: Sep. 29, 2011

(65) Prior Publication Data
US 2013/0187705 A1    Jul. 25, 2013

(30) Foreign Application Priority Data

Mar. 25, 2010  (DE) .......................... 10 2010 012 961
Sep. 8, 2010   (DE) .......................... 10 2010 044 778

(51) Int. Cl.
*G01R 27/26* (2006.01)
*H03K 17/96* (2006.01)
*G06F 3/044* (2006.01)
*H03K 17/955* (2006.01)

(52) U.S. Cl.
CPC .............. *H03K 17/962* (2013.01); *G06F 3/044* (2013.01); *H03K 17/955* (2013.01); *H03K 2017/9604* (2013.01)

(58) Field of Classification Search
CPC .. H04L 27/12; A61B 2019/448; A61B 6/032; A61B 6/56; G01J 5/22; G01N 15/10; G01R 33/34007; G01R 33/341; G01R 33/3415; G01R 33/3692; G01R 27/2605; G01R 35/00; G01R 1/18; G01R 1/30; G01S 13/56; G01S 13/753; G01S 15/34; G01S 1/685; G01S 1/72; G01S 3/58; G01S 15/04; G01S 7/539; G01S 13/04; G01S 17/89; G01S 7/4802; G01S 17/026; G01S 7/4817; G06F 3/044; G06F 3/0416; G06F 3/041; G06F 2203/04106; G06F 1/3262; G06F 2203/04101; G06F 3/0414; G06F 3/045; G06F 3/04815; G06F 3/0488; G01D 5/24; G01D 21/00; G01D 5/2417; H04B 5/0012; H03L 17/962; H03K 17/955; H03K 2017/9604; G06K 9/00228; G08B 13/1427; G08B 21/04
See application file for complete search history.

(56) References Cited

U.S. PATENT DOCUMENTS 6,066,954 A  *  5/2000  Gershenfeld et al. ......... 324/671
8,115,499 B2 *  2/2012  Osoinach et al. ............. 324/686
(Continued)

FOREIGN PATENT DOCUMENTS

WO   2009/130165 A2   10/2009   ............. G06F 3/033
WO   2011/117369 A1    9/2011   ............. G06F 3/044

OTHER PUBLICATIONS

International Search Report and Written Opinion, Application No. PCT/EP2011/054573, 7 pages, Jul. 8, 2011.
(Continued)

*Primary Examiner* — Vinh Nguyen
(74) *Attorney, Agent, or Firm* — Slayden Grubert Beard PLLC (57) ABSTRACT

An electrode device for a capacitive sensor device and a circuit arrangement for a capacitive sensor device for the operation of an electrode device are provided, wherein the electrode device has a first electrode structure with at least one transmitting electrode and at least one receiving electrode, and a second electrode structure with at least one field sensing electrode, wherein the electrode device or the capacitive sensor device can be operated in a first operation mode and in a second operation mode. In addition a method is provided for approach and/or touch detection with a sensor device.

24 Claims, 4 Drawing Sheets

(56) References Cited

U.S. PATENT DOCUMENTS

| | | | |
|---|---|---|---|
| 2003/0021078 A1* | 1/2003 | van Berkel | 361/234 |
| 2009/0262078 A1 | 10/2009 | Pizzi | 345/169 |
| 2012/0043975 A1* | 2/2012 | Wuerstlein et al. | 324/671 |

OTHER PUBLICATIONS

International Preliminary Report on Patentability and Written Opinion, Application No. PCT/EP2011/054573, 5 pages, Sep. 25, 2012.

* cited by examiner

Modus 1

Fig. 1

Modus 2

Modus 2

Fig. 2c

Modus 1

ELECTRODE DEVICE, CIRCUIT ARRANGEMENT AND METHOD FOR THE APPROACH AND TOUCH DETECTION

CROSS-REFERENCE TO RELATED APPLICATIONS

This application is a U.S. National Stage Application of International Application No. PCT/EP2011/054573 filed Mar. 24, 2011, which designates the United States of America, and claims priority to German Application No. 10 2010 012 961.5 filed Mar. 25, 2010 and German Application No. 10 2010 044 778.1 filed Sep. 8, 2010, the contents of which are hereby incorporated by reference in their entirety.

TECHNICAL FIELD

Various embodiments relates to an electrode device for the approach and touch detection, especially for detecting an approach to an electric device or a touch of an electric device by an object. In addition, various embodiments relates to a circuit arrangement for the operation of an electrode device according to various embodiments as well as a method for the approach and touch detection with an electrode device according to various embodiments or a circuit arrangement according to various embodiments.

BACKGROUND

In the prior art capacitive sensor devices are known, which can be arranged for example on a hand apparatus, in order to detect an approach by a hand to the hand apparatus. Through a variation of the dielectric properties in the area of the sensor electrodes of the capacitive sensor device an approach, for example of a hand to the sensor device can be derived.

In this respect it is disadvantageous, that it cannot be clearly distinguished between an approach to the hand apparatus and a touch of the hand apparatus. Another disadvantage consists in that a further approach to the sensor device, for example a second hand, can no longer be reliably detected after a detection of a touch by a hand occurred.

SUMMARY

According to various embodiments solutions can be provided that allow to detect a touch of a hand apparatus, for example by a hand, and to reliably detect another approach to the hand apparatus, for example a second hand, after the hand apparatus is touched by the hand.

According to various embodiments, a method for approach and/or touch detection with a sensor device may comprise at least one transmitting electrode, one receiving electrode and a field sensing electrode, wherein the transmitting electrode and the receiving electrode are supplied with an alternating electrical signal, and from the at least one field sensing electrode an electric signal is tapped and evaluated, wherein the electric signal is indicative for at least one of an approach and a touch.

BRIEF DESCRIPTION OF THE DRAWINGS

Further details and properties of various embodiments as well as concrete embodiments of various embodiments result from the following description in connection with the drawings. The figures show.

DETAILED DESCRIPTION

Therefore according to various embodiments, an electrode device can be provided for a capacitive sensor device, comprising
a first electrode structure with at least one transmitting electrode and at least one receiving electrode, and
a second electrode structure with at least one field sensing electrode, in which
in a first operation mode, the at least one transmitting electrode can be supplied with a first alternating electrical signal and a first electrical signal can be tapped from the at least one receiving electrode, and
in a second operation mode, at least one electrode of the first electrode structure can be supplied with an alternating electrical signal and a second electrical signal can be tapped from the at least one field sensing electrode.
It is advantageous, when
in the first operation mode, a first electric alternating field emitted at the transmitting electrode can be coupled to the receiving electrode and to the field sensing electrode, and
in the second operation mode, a first electric alternating field emitted at the transmitting electrode and a second electric alternating field emitted at the receiving electrode can be coupled to the field sensing electrode.
Thereby
in the first operation mode, the first electric signal which is tapped from the receiving electrode, and
in the second operation mode, the second electric signal which is tapped from the field sensing electrode may be indicative for an approach of an object to the sensor device.

The first electrode structure and the second electrode structure can be coupled with an evaluating device, in which a first threshold value can be assigned to the first operation mode, and wherein the evaluating device is adapted to change from the first operation mode into the second operation mode, as soon as the first electric signal exceeds or falls below the first threshold value.

The fact that the signal exceeds or falls below the first threshold value (when e.g. a hand approaches to the electrode structure), substantially depends whether the electrode structure is operated in the so-called transmission mode or in the so-called absorption mode. In the transmission mode, in case of an approaching hand, the threshold value is exceeded, because the hand increases the capacitive coupling between the electrodes. In the absorption mode, in case of an approaching hand, the threshold value is fallen below, because part of the field lines between the electrodes are deviated from mass (earth) via the hand.

A second threshold value can be assigned to the second operation mode, the evaluating device being adapted to choose the second threshold value according to the first threshold value. The second threshold value can also be selected according to the first electric signal.

The evaluating device can be adapted
   to provide a first detection signal, as soon as the first electric signal exceeds or falls below the first threshold value, and
   to provide a second detection signal, as soon as the second electric signal exceeds or falls below the second threshold value.

The first electrode structure additionally may include at least one compensation electrode It is advantageous, when
   in the first operation mode the at least one compensation electrode can be supplied with a second alternating electrical signal, and
   in the second operation mode at least one electrode (EE, SE, KE) of the first electrode structure can be supplied with the alternating electrical signal.

It is further advantageous, when
   in the first operation mode, a first alternating electric field emitted at the transmitting electrode can be coupled to the receiving electrode, and
   in the second operation mode, a first alternating electric field emitted at the transmitting electrode and/or a second alternating electric field emitted at the receiving electrode and/or a third alternating electric field emitted at the compensation electrode can be coupled to the at least one field sensing electrode.

The second alternating electrical signal may be selected in such a way, that in the first operation mode, the alternating electric field emitted at the compensation electrode can substantially be coupled only to the receiving electrode.

The compensation electrode, the receiving electrode and the field sensing electrode can be arranged the one relatively to the others, so that an alternating electric field emitted at the compensation electrode can substantially be coupled only to the receiving electrode.

The second alternating electrical signal may be phased-shifted with respect to the first alternating electrical signal and/or it can have a smaller amplitude than the first alternating electrical signal.

The second alternating electrical signal may be in phase with the first alternating electrical signal.

In the second operation mode, the at least one compensation electrode may be supplied with a fourth alternating electrical signal.

In the second operation mode, the at least one receiving electrode may be supplied with a third alternating electrical signal.

In the second operation mode, the at least one transmitting electrode may be supplied with the first alternating electrical signal, whereby in the second operation mode the third alternating electrical signal is substantially in phase with the first alternating electrical signal.

The at least one compensation electrode may be coupled to mass (ground or mass 20 of apparatus) in the first operation mode and/or in the second operation mode.

Also a circuit arrangement is provided for a capacitive sensor device for the operation of an electrode device, especially an electrode device according to various embodiments, comprising
   an evaluating device, which may be coupled with the first electrode structure and with the second electrode structure, and
   at least one signal generation device, that may be coupled with the first electrode structure,
wherein the evaluating device and the signal generation device may be operated in first operation mode and in a second operation mode, in which
   in the first operation mode, a first electric signal tapped from the at least one receiving electrode may be fed to the evaluating device and may be evaluated by the evaluating device, the signal generation device generates a first alternating electrical signal, which may be supplied to the at least one transmitting electrode,
   in the second operation mode, the signal generation device generates an alternating electrical signal, which may be supplied to least to one electrode of the first electrode structure, and a second electrical signal may be fed to at least one field sensing electrode of the evaluating device and may be evaluated by the evaluating device.

In the first operation mode, the signal generation device may generate a second alternating electrical signal, which may be supplied to the at least one compensation electrode and whereby in the second operation mode the signal generation device generates an alternating electrical signal, which may be supplied at least to one electrode of the first electrode structure.

A first threshold value can be assigned to the first operation mode, wherein the evaluating device and the signal generation device are adapted to change from the first operation mode into the second operation mode, as soon as the first electric signal exceeds or falls below the first threshold value, which in turn depends on the fact that the transmission mode or the absorption mode are used.

A second threshold value can be assigned to the second operation mode, wherein the evaluating device is adapted to choose the second threshold value according to the capacitive coupling between the transmission electrode and the receiving electrode in the first operation mode.

The evaluating device may be adapted to choose the second threshold value according to the capacitive coupling between the compensation electrode and the receiving electrode.

The evaluating device may be adapted
   to provide a first detection signal, as soon as the first electric signal exceeds the first threshold value, and
   to provide a second detection signal, as soon as the second electric signal exceeds the second threshold value.

The circuit arrangement may further include: a phase shifter or an inverter for changing the phase of the second alternating electrical signal in the first operation mode.

In addition, a method for the approach and contact detection is provided, comprising at least the following steps:
   in a first operation mode
      supplying at least one transmitting electrode with a first alternating electrical signal, and evaluation of a first electric signal tapped from least at one receiving electrode, and in a second operation mode
supplying at least one electrode (transmitting electrode or receiving electrode) of a first electrode structure with an alternating electrical signal, and
evaluation of a second electric signal tapped from least at a field sensing electrode.

The method further may include:
in a first operation mode, supplying at least one compensation electrode with a second alternating electrical signal, and
in a second operation mode, supplying at least one electrode (transmitting electrode or receiving electrode or compensation electrode) of the first electrode structure with an alternating electrical signal.

In the second operation mode, at least two electrodes of the first electrode structure be supplied with an alternating electrical signal.

In addition, a method for the approach and touch detection is provided with a sensor device, the sensor device comprising at least one transmitting electrode, one receiving electrode and one field sensing electrode, wherein the sensor device may be operated in a first operation mode and in a second operation mode, in which
the transmitting electrode is supplied with a first alternating electrical signal, so that, at the transmitting electrode, a first electric alternating field is emitted, which can be coupled to the receiving electrode and to the field sensing electrode,
in the first operation mode a first electric signal is evaluated which is tapped from the receiving electrode, and
in the second operation mode
the receiving electrode is supplied with a third alternating electrical signal, so that, at the receiving electrode, a second electrical alternating field is emitted, which can be coupled to the field sensing electrode, and
a second electrical signal tapped from the field sensing electrode is evaluated.

A first threshold value, which is indicative for a touch of the sensor device by an object, can be assigned to the first operation mode, wherein the sensor device changes from the first operation mode into the second operation mode, as soon as the first electric signal exceeds the first threshold value.

A second threshold value, which is indicative for an approach of the object to the sensor device, can be assigned to the second operation mode, said second threshold value being selected according to the first threshold value.

The sensor device may further include a compensation electrode, in the first operation mode the compensation electrode being supplied with a second alternating electrical signal, wherein the phase and/or the amplitude of the second alternating electrical signal are different from the phase and/or the amplitude of the first alternating electrical signal.

Further a method is provided for the approach and/or touch detection with a sensor device, wherein the sensor device comprises at least one transmitting electrode, one receiving electrode and one field sensing electrode, in which
the transmitting electrode and/or the receiving electrode are supplied with an alternating electrical signal, and
an electric signal is tapped from and evaluated at the at least one field sensing electrode, the electric signal being indicative for an approach and/or a touch.

The sensor device additionally may comprise a compensation electrode, the compensation electrode being supplied with the alternating electrical signal.

The transmitting electrode, the receiving electrode, the field sensing electrode and the compensation electrode can be arranged relative to each other or the alternating electrical signal can be set in such a way, that a first alternating electric field emitted at the transmitting electrode and/or a second alternating electric field emitted at the receiving electrode and/or a third alternating electric field emitted at the compensation electrode can be coupled to the at least one field sensing electrode.

The alternating electrical signals which are supplied at the transmitting electrode, in each case can be different one another at the receiving electrode and at the compensation electrode.

The electrode structure may be arranged in or at an electric hand apparatus. The electric hand apparatus may be a computer mouse, a mobile phone, a remote control, an input or control means for a game console, a minicomputer or similar. By various embodiments also an electrical hand apparatus is provided, especially a computer mouse, a mobile phone, a remote control, an input or control means for game consoles, minicomputers or similar, which comprises an electrode structure according to various embodiments. Preferably the electrode structure is coupled to a circuit arrangement according to various embodiments, which can preferably be operated according to the method of various embodiments.

Figure 1:
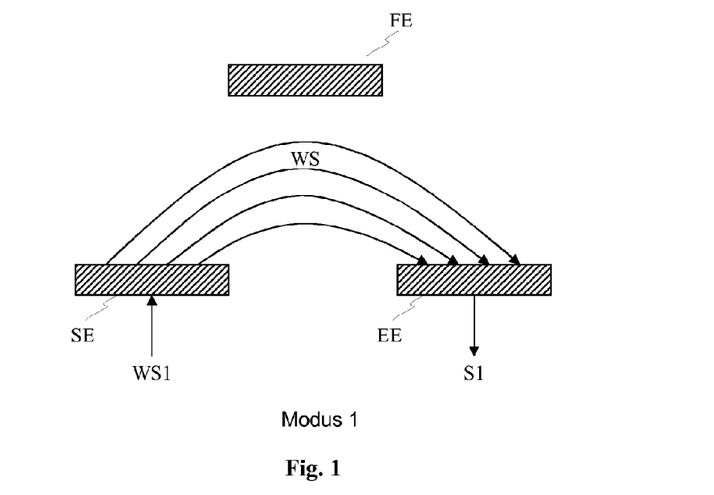
FIG. 1 three sensor electrodes of an electrode arrangement according to various embodiments, which are operated in a first operation mode (touch detection or detection of embracing)

FIG. 1 shows three sensor electrodes of a sensor device according to various embodiments, which are operated in a first operation mode.

As the first operation mode is designated that operation mode, in which a touch is detected of the sensor device by a hand. The sensor electrodes can be arranged at or into an electric hand apparatus, in order to detect a touch or an embracing of the electric hand apparatus. Examples of an arrangement of the sensor electrodes at a hand apparatus are described in more details with respect to FIG. 5 and FIG. 6.

The sensor device comprises one transmitting electrode SE, one receiving electrode EE and one field sensing electrode FE. In the first operation mode, i.e. in the operation mode in which one detects a touch by a hand of the sensor device or the touch of an electric hand apparatus, in which the sensor device is arranged, the transmitting electrode SE is supplied with a first electric alternating signal of a certain frequency and amplitude. The first electric alternating signal can be provided by a signal generator, which is not shown in this figure. The first electric alternating signal is designated in the following as a first alternating signal or as a first alternating electrical signal.

The alternating electrical signal WS1 driven, i.e. supplied at the transmitting electrode SE has a frequency of about 10 kHz to 1 MHz. The alternating electrical signal WS1 which is driven at the transmitting electrode SE can preferably have a frequency of about 50 kHz to 300 kHz. Preferably, the first alternating electrical signal which is driven at the transmitting electrode SE has a frequency between 75 kHz and 150 kHz. In the following driving an electrode with a signal means supplying the electrode with the signal.

The transmitting electrode SE or the first alternating electrical signal WS1 which is driven at the same are designed in such a way, that the alternating electric field WS emitted by the transmitting electrode SE can be coupled to the receiving electrode EE. Especially the transmitting electrode SE or the first alternating electrical signal WS1 which is driven at the same is designed in such a way, that the alternating electric field WS emitted at the transmitting electrode SE in case of an approach, for example of a hand, to the sensor electrode SE and to the receiving electrode EE, is coupled to the receiving electrode EE by the approaching hand. The alternating electric field WS coupled to the receiving electrode EE gives rise to a field current flowing between the transmitting electrode SE and the receiving electrode EE, wherein the strength of the field current is used as indicator for the approach of a hand to the transmission electrode SE and to the receiving electrode EE or for a touch of the transmitting electrode SE and the receiving electrode EE by a hand.

The transmitting electrode SE and the receiving electrode EE are preferably arranged relative to each other at a hand apparatus, so that the alternating electric field WS emitted at the transmitting electrode SE is substantially coupled only to the receiving electrode, when the hand apparatus is embraced by a hand.

When no hand is near to the transmitting electrode SE and to the receiving electrode EE or when the transmitting electrode SE and the receiving electrode EE are not touched by a hand, the electric current flowing in the receiving electrode EE has a level, which lies below a predetermined switching level. Only in the case of a sufficient small distance of a hand to the electrodes SE, EE the electric current flowing in the receiving electrodes EE exceeds the predetermined switching level, so that an approach to both these electrodes is detected. Preferably the predetermined switching level is exceeded only, when the electrodes SE and EE are touched by a hand.

In the first operation mode, the field sensing electrode FE shown in FIG. 1 is inactive, i.e. at the field sensing electrode FE neither an alternating signal is charged, nor an electrical signal is picked up at, i.e. tapped from the field sensing electrode FE. The field sensing electrode FE is intended to detect an approach, for example of a further hand, to the sensor device, after, in the first operation mode, it has detected an approach to the transmitting electrode SE and to the receiving electrode EE or a touch of the transmitting electrode SE and the receiving electrode EE by a hand.

As soon as the field current flowing between the transmitting electrode SE and the receiving electrode EE exceeds or falls below a predetermined threshold value or a predetermined switching level, the sensor device changes from the first operation mode to a second operation mode. In the second operation mode, another approach is detected, for example of a second hand, to the sensor device. The detection of a further approach to the sensor device is explained in the following more in detail with reference to FIGS. 2a, 2b and 2c.

Figure 2A:
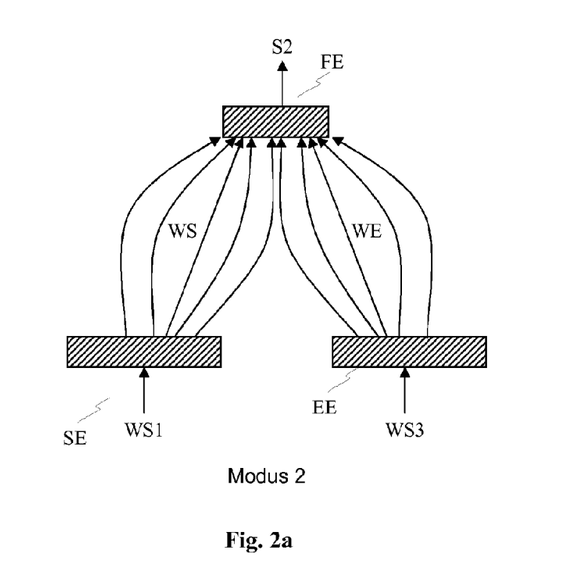
FIGS. 2a-2c sensor electrodes of an electrode arrangement according to various embodiments, which are operated in a second operation mode (approach detection)

FIG. 2a shows the sensor electrodes SE, EE, FE which were illustrated in FIG. 1, which are operated in the second operation mode. In this second operation mode the transmitting electrode SE is driven with a first alternating electrical signal WS1, so that an alternating electric field WS is emitted at the transmitting electrode SE. In the second operation mode, the receiving electrode EE is used also as a transmitting electrode, i.e. a third alternating electrical signal WS3 is driven at the receiving electrode EE, so that an alternating electric field WS is emitted at the receiving electrode EE.

The alternating electrical signals WS1, WS3 driven at the transmitting electrode SE and at the receiving electrode EE are designed in such a way that the alternating electric fields WS or WE irradiated at the transmitting electrode SE or at the 30 receiving electrode EE are coupled to the field sensing electrode FE. The alternating electrical signals WS1, WS3 are designed especially in such a way, that the alternating electric fields WS and WE irradiated at the transmitting electrode SE or at the receiving electrode EE are coupled to the field sensing electrode FE, when an object, for example a hand, approaches to the sensor device, so that the alternating electric fields WS is coupled to the field sensing electrode FE by the approaching hand.

The alternating electrical signals WS1 and WS3 can be identical, i.e. each time they can have the same amplitude, the same frequency and the same phase. The alternating electrical signals WS1 and WS3 however can also be different, wherein the signal parameters, amplitude, frequency and/or phase can be different.

Figure 2B:
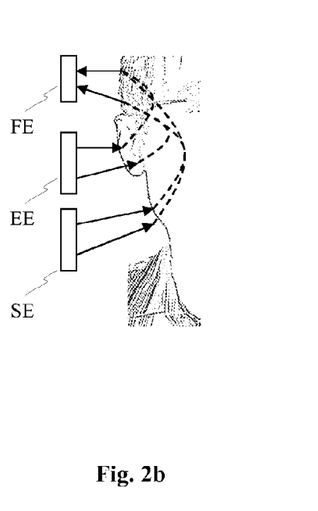

A field coupling between the electrodes SE, EE and the field sensing electrode FE is shown in FIG. 2b. In this example, the sensor device, which can be arranged for example in an electric hand apparatus, is carried by a user on his ear, so that the electric alternating fields WS and WE couple to the field sensing electrode FE by means of the head of the user. The alternating fields WS and WE coupled to the field sensing electrode FE, i.e. in such a way that the alternating field resulting from the alternating fields WS and WE gives rise to a field current flow between the electrodes SE and EE and the field sensing electrode FE, which can be used as an indicator for the approach of an object, for example a head, to the sensor device, after an approach or a touch of the sensor device in the first operation mode has occurred.

When changing from the first operation mode to the second operation mode, the receiving electrode EE is switched from a receiving mode to a transmitting mode. In this way the two coupling capacitances between the transmitting electrode SE and the head of the user and between the receiving electrode EE and the head of the user will be added. By the operation of the receiving electrode EE in the second operation mode as a further transmitting electrode, the influence of the receiving electrode EE on the approximation detection in the second operation mode, which would result, if the receiving electrode EE would be operated moreover as receiving electrode in the second operation mode, is reduced, because the receiving electrode EE does not form a voltage divider, which influences the field current flowing in the field sensing electrode FE.

When switching to the second operation mode, the first alternating electrical signal WS1 can also be changed, i.e. the frequency and/or the amplitude e.g. can be adjusted.

The detection of an approach to the sensor device in the second operation mode is almost completely independent from the way in which the hand apparatus is held by the hand or almost completely independent from the detection of an embracing by a hand which occurred before, which is done in the first operation mode. The detection of an approach to the sensor device in the second operation mode thus is clearly more robust and the field current measured at the field sensing electrode FE can be used as a reliable measure for the approach of the user to the sensor device.

As soon as the field current flowing at the field sensing electrode FE exceeds a predetermined threshold value, this can be used as an indicator for a certain approach of the user to the sensor device.

In order to improve even more the precision of the detection and the robustness of the detection of an approach in the second operation mode, it is advantageous to choose the threshold value in the second operation mode depending on the thresh old value in the first operation mode. Preferably in the second operation mode the threshold value is selected according to the signal level of the first signal in the first operation mode. This ensures that the distance of a user to the sensor device at which the threshold value is exceeded in the second operation mode, remains substantially constant. This means, that the distance, in which the threshold value is exceeded in the second operation mode, is independent from the way in which for example a hand apparatus is held with the sensor device according to various embodiments or how firmly a hand apparatus is embraced by a hand.

The threshold value in the second operation mode is set to earth substantially depending on the capacitive coupling of the sensor device by means of the user. In a slight capacitive coupling of the sensor device by means of the user to earth it will flow a large field current in the first operation mode between the transmitting electrode SE and the receiving electrode EE, so that the threshold value can be accordingly raised in the second operation mode. If the capacitive coupling between the sensor device by means of the user to earth is particularly good, a substantially smaller current will flow in the first operation mode between the transmitting electrode SE and the receiving electrode EE, so that the threshold value is also accordingly set to a small value in the second operation mode.

In the second operation mode for example a device function, which is triggered as soon as the second threshold value is exceeded, can be assigned to the threshold value. If the sensor device according to various embodiments for example is arranged in a mobile phone, a device function of the mobile phone can be assigned to the threshold value in the second operation mode, which switches off the display of the mobile phone when exceeding this threshold. Selecting the threshold value in the second operation mode depending on the threshold value in the first operation mode, it is avoided, that a user observes or perceives different trigger thresholds, for example for turning off the display of a mobile phone.

Figure 2C:
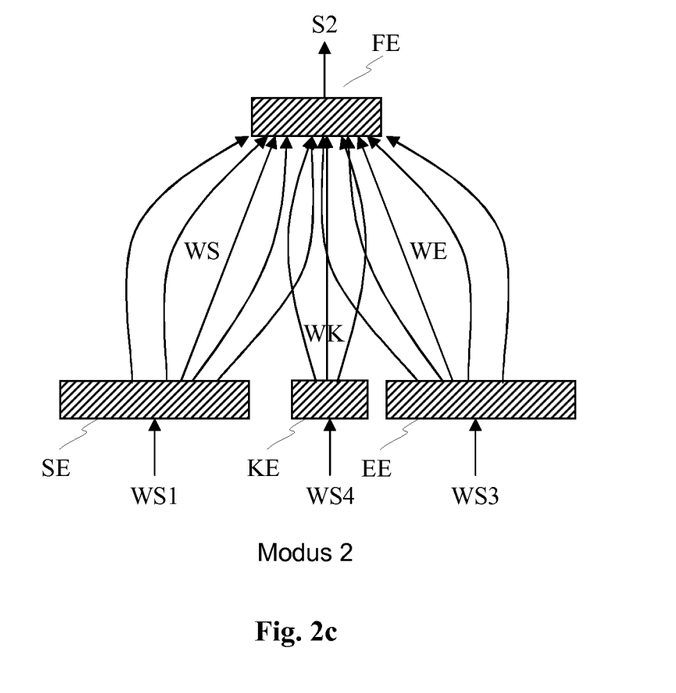

In order to improve even more the precision of detection and the robustness of the detection of an approach in the second operation mode, it is advantageous to use a compensation electrode provided in the first operation mode also as transmitting electrode in the second operation mode, as shown in FIG. 2c. The function of the compensation electrode in the first operation mode is described in more detail with reference to FIG. 3.

FIG. 2c shows the electrodes SE, EE and FE which were described with reference to FIG. 2a, which are operated in the second operation mode. Additionally to the electrodes SE, EE and FE also the compensation electrode KE is operated in the second operation mode. The compensation electrode KE is charged with a fourth alternating electrical signal WS4, so that a third alternating electrical field WK is emitted at the compensation electrode KE. Unlike the first operation mode the fourth alternating electrical signal WS4 is not out of phase with respect to the first alternating electrical signal WS1, but it is substantially in phase with the first alternating electrical signal WS1, in order to guarantee an improvement of the precision of detection.

In the case of a hand approaching to the sensor device in the second operation mode now also the third alternating electric field WK is coupled by the hand (or by means of the head, see FIG. 2b, in which the compensation electrode KE is not shown) to the field sensing electrodes FE. A sufficient coupling for detecting the approach in the second operation mode can be thus guaranteed in a better way.

According to various embodiments only one or two of the three electrodes SE, KE and EE can be used as transmission electrodes in the second operation mode, which ultimately depends on the capacitive properties of the environment and on the specific case of application. For example only the receiving electrode EE and the compensation electrode KE as transmission electrodes can also be provided for the second operation mode (e.g. when the compensation electrode KE is arranged near to the receiving electrode EE). In a further application only the compensation electrode KE as transmitting electrode for the second operation mode can also be provided. The electrodes which are not used as transmission electrodes in the second operation mode preferably are separated from the evaluating device, in order to form no voltage dividers, which would negatively influence the approach detection.

Figure 3:
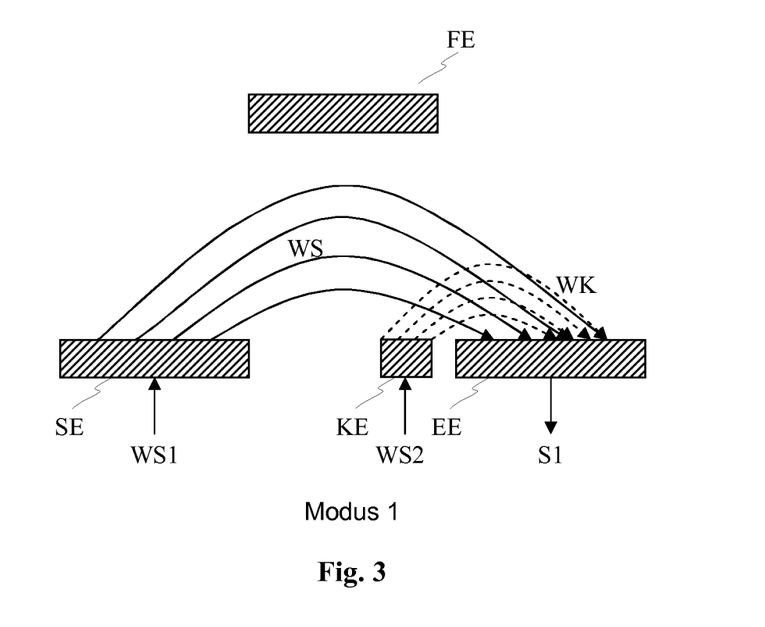
FIG. 3 another embodiment of sensor electrodes of an electrode arrangement according to various embodiments for the operation in the first operation mode (touch detection or detection of embracing)

FIG. 3 shows the sensor electrodes SE, KE, EE of a sensor device according to various embodiments, which are operated in a first operation mode. Additionally to the sensor electrodes which were shown in FIG. 1, the sensor device has a compensation electrode KE.

Figure 4A:
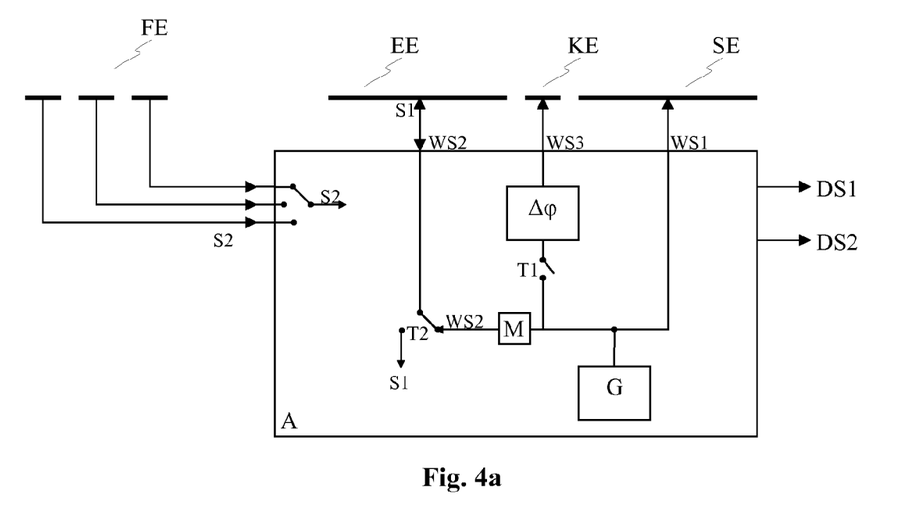
FIG. 4a a first block diagram of a possible embodiment of a sensor device.

The compensation electrode KE is driven with a second alternating electrical signal in the first operation mode WS2, which preferably comprises the waveform and the frequency of the alternating electrical signal WS1, which is driven at the transmitting electrode SE. The alternating electrical signal WS2, with which the compensation electrode KE is driven, is out of phase with respect to the alternating electrical signal WS1 at the transmitting electrode SE. The phase shifting for example can be accomplished with a phase shifter, as it is described in more detail with reference to FIG. 4. Instead of a phase shifter, inverters can also be provided. In addition to the phase shifter or inverter also an attenuator can be provided, in order to attenuate the amplitude of the alternating electrical signal WS2 which is driven at the compensation electrode. The phase can also be 0°.

The compensation electrode KE or the alternating electrical signal WS2 which is driven at the latter is designed in such a way, that the alternating electric field WK emitted at the compensation electrode KE can be coupled to the receiving electrode EE.

By the electric alternating field WK emitted at the compensation electrode KE the level of the alternating electric field acting at the receiving electrode EE, which results from the alternating electric fields WS and WK, is reduced or (almost) erased in a superposition in counter phase, i.e. in a phase shifting of 180°.

In the case of a hand approaching to the electrodes SE, KE and EE the coupling between the transmitting electrode SE and the receiving electrode EE becomes increasingly better, because the alternating electric field WS emitted at the transmitting electrode SE is partially coupled to the receiving electrode EE by the approaching hand and thus eludes the activity area of the alternating electric field WK emitted at the compensation electrode KE. The approaching hand acts there almost as bridging of the compensation electrode KE.

The arrangement of the transmitting electrode SE, the compensation electrode KE and the receiving electrode EE at an electric hand apparatus preferably is selected in such a way, that the bridging effect between the transmitting electrode SE and the receiving electrode EE cannot be produced with a single finger, so that in a corresponding arrangement of the transmitting electrode SE relative to the receiving electrode EE an embracing of the hand apparatus by means of a hand can be reliably detected. This will allow, that an embracing of a hand apparatus can be reliably detected, before the sensor device is switched to the second operation mode.

In the following block diagrams are shown of two embodiments of a sensor device according to various embodiments with reference to FIG. 4a and FIG. 4b. Unlike the denominations which were used in FIG. 1 to FIG. 3 for the alternating electrical signals WS1, WS2, WS3 and WS4 driven at the sensor electrodes in FIG. 4a and FIG. 4b the following denominations are used:

WS1: alternating electrical signal, which is driven at the transmitting electrode SE;

WS2: alternating electrical signal, which is supplied at the receiving electrode EE (depending on the operation mode); and WS3: electrical alternating signal, which is driven at the compensation electrode KE.

FIG. 4a shows a block diagram of a sensor device according to various embodiments. Each of the electrodes FE, EE, KE and SE is coupled with an evaluating device A. The compensation electrode KE and the transmitting electrode SE are coupled to the evaluating device A, in such a way that each of them can be driven with an alternating electrical signal WS3 or WS1 by the evaluating device. The field sensing electrodes FE are coupled to the evaluating device A in such a way that an electrical signal S2 applied at the field sensing electrodes FE can be fed to the evaluating device A.

The receiving electrode EE is coupled to the evaluating device A in such a way, that, depending on the respective operation mode of the sensor device, the receiving electrode EE either can be driven with an alternating electrical signal WS2 or a electric signal S1 picked up at the receiving electrode EE can be fed to the evaluating device A.

The switch setting of the switches T1 and T2 shown in FIG. 4a corresponds to the switch setting in the second operation mode. As one can see in FIG. 4a, in this second operation mode the transmitting electrode SE is driven with a first alternating electrical signal WS1 by a signal generator G and the receiving electrode EE is driven with a second alternating electrical signal WS2. In one embodiment, the alternating electrical signals WS1 and WS2 can be identical.

Alternatively the second alternating electrical signal WS2 can also be different from the first alternating electrical signal WS1. In order to achieve it, the signal provided from the signal generator G can first be fed to a modulation element M. The modulated, i.e. varied generator signal, provided by the modulation element M, is then driven at the receiving electrode EE. The modulation element M can change for example the amplitude of the generator signal. Instead of the modulation element M also another signal generator can be provided, which provides a second alternating electrical signal WS2 which is different from the first alternating electrical signal WS1.

The switch T1 is in the opened position, so that the compensation electrode KE is not driven with an alternating signal by the signal generator G. In this operation mode shown in this document, each of the transmitting electrode SE and at the receiving electrode EE emits an alternating electric field, which is coupled to the field sensing electrodes FE. The signal S2 which is picked up at the field sensing electrode FE is fed to the evaluating device A.

In the first operation mode, i.e. in the operation mode in which the approach to the transmitting electrode SE and to the receiving electrode EE is detected or the touch of the transmitting electrode SE and the receiving electrode EE is detected, the switch T1 is in the closed position and the switch T2 is in a position, in which the alternating signal WS2 provided by the signal generator G is not driven at the receiving electrode EE. In the first operation mode, the signal S1 which is picked up at the receiving electrode EE is fed to the evaluating device A. The compensation electrode KE is driven with an alternating electrical signal WS3, which is dephased with respect to the electric switching signal WS1 which is driven at the transmitting electrode SE. For this purpose, for example, a phase shifter A9 can be provided. The phase shifting can be set between 0° and 180°. In practice, it has been found, however, that a phase shift between 90° and 180° and most preferably a phase shift between 140° and 180° are particularly advantageous. As stated with reference to FIG. 3, the phase shift can also be 0°.

In a further embodiment not shown in this document, instead of a phase shifter an inverter can also be provided, with which the alternating signal provided by the signal generator G is inverted. Preferably the alternating electrical signal WS3 is attenuated, so that at the compensation electrode KE substantially an alternating signal WS3 is driven, which is dephased by 180° with respect to the alternating signal WS1 at the transmitting electrode SE and comprises at the same time a smaller amplitude than the alternating signal WS 1. It can also be advantageous, when the alternating signals WS1 and WS3 have the same phase. The amplitude of the alternating signals WS1 and WS3 can be different or it can be identical.

In the embodiment which is shown in this document, the evaluating device A provides two detection signals DS1 and DS2, in which the detection signal DS1 can be used as indicator for exceeding of the first threshold in the first operation mode and the second detection signal DS2 can be used as indicator for exceeding of the second threshold in the second operation mode.

Figure 4B:
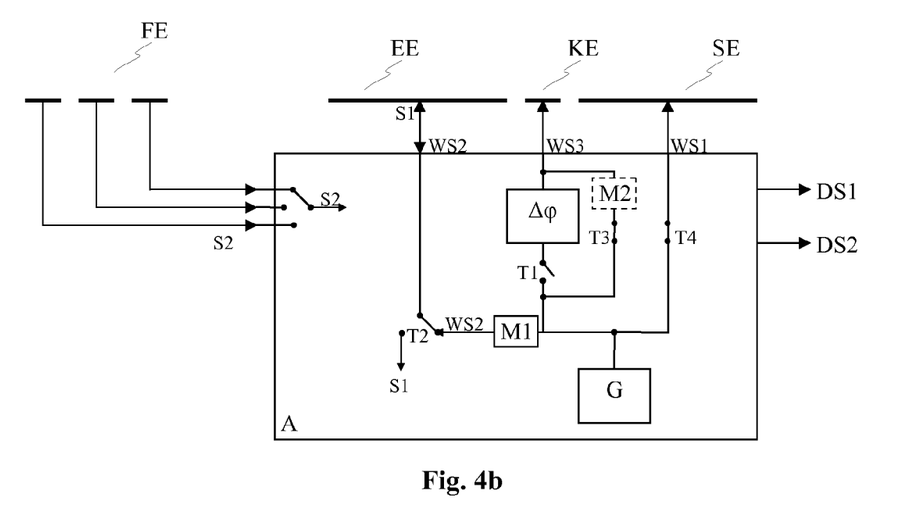
FIG. 4b a second block diagram of a possible embodiment of a sensor device.

FIG. 4b shows a second block diagram of a sensor device according to various embodiments. Each of the electrodes FE, EE, KE and SE is coupled to an evaluating device A. The compensation electrode KE and the transmitting electrode SE are coupled to the evaluating device A in such a way, that each of these can be charged with an alternating electrical signal WS2 or WS1 by the evaluating device. The field sensing electrodes FE are coupled to the evaluating device A in such a way, that an electrical signal S2 applied to the field sensing electrodes FE can be fed to the evaluating device A.

The receiving electrode EE is coupled to the evaluating device A in such a way, that, depending on the respective operation mode of the sensor device, the receiving electrode EE can be driven either with an alternating electrical signal WS3 or an electrical signal S1 which is picked up at the receiving electrode EE can be fed to the evaluating device A.

The switch setting of the switches T1, T2, T3 and T4 shown in FIG. 4b corresponds to the switch setting in the second operation mode. As one can see in FIG. 4b, in this second operation mode the transmitting electrode SE is driven with a first alternating electrical signal WS1 by a signal generator G. The receiving electrode EE is driven with an alternating electrical signal WS2. In one embodiment the alternating electrical signals WS1 and WS2 can be identical.

Alternatively the alternating electrical signal WS2 can also be different from the alternating electrical signal WS1. In order to achieve it, the signal provided by the signal generator G can be first fed to a first modulation element Ml. The modulated, i.e. varied generator signal, provided by the modulation element M1 is then applied to the receiving electrode EE. The modulation element M1 can for example change the amplitude of the generator signal. Instead of the modulation element M1 also another signal generator can be provided, which provides an alternating signal WS1 which is different from the alternating electrical signals WS2.

The switch T1 is in the opened position, so that the compensation electrode KE is not driven with an alternating signal, which is dephased with respect to the alternating electrical signal G from the signal generator. In the embodiment which is shown in FIG. 4b the alternating electrical signal which is provided by the signal generator G is directly applied to the compensation electrode KE, because the switch T3 is closed. Additionally another modulation element M2 can be provided, in order to modulate the alternating electrical signal provided by the signal generator G, before it is applied to the compensation electrode KE. The modulation element M2 can change for example the amplitude of the generator signal.

Between the signal generator G and the transmitting electrode SE also a switch T4 is provided, which here lies in a closed position. Additionally also the generator signal which is driven at the transmitting electrode SE can be fed to a modulation element which is not shown in this document, before it is applied to the transmitting electrode SE.

In the first operation mode, i.e. in the operation mode, in which the approach to the transmitting electrode SE and to the receiving electrode EE is detected or the touch of the transmitting electrode SE and the receiving electrode EE is detected, the switch T1 is in the closed position and the switch T2 is in a position, in which the alternating signal WS2 provided by the signal generator G is not applied to the receiving electrode EE. The switch T3 is in an open position and the switch T4 is in a closed position.

In the first operation mode, the signal S1 which is picked up at the receiving electrode EE is fed to the evaluating device A. The compensation electrode KE is driven with an alternating electrical signal WS3 in the first operation mode, which is dephased with respect to the alternating electrical signal WS1 which is applied to the transmitting electrode SE. For this purpose for example a phase shifter $\Delta\phi$ can be provided. The phase shifter can be set between 0° and 180°. In practice, it has been found, however, that a phase shift between 90° and 180° and most preferably a phase shift between 140° and 180° are particularly advantageous. Instead of the phase shifter $\Delta\phi$ an inverter can also be provided.

It can also be advantageous, when the alternating signals WS1 and WS3 have the 5 same phase. The amplitude of the alternating signals WS1 and WS3 can be different or it can be identical.

With the help of the switches T1, T2, T3 and T4 all the electrodes of the first electrode structure, i.e. the electrodes EE, KE and SE, can each be driven with an alternating electrical signal in the second operation mode. In a corresponding switch setting of the switches T1 to T4 only some of the electrodes EE, KE and SE can be driven with an alternating electrical signal. For example it can be advantageous to drive only the receiving electrode EE and the compensation electrode K with an alternating electrical signal in the second operation mode. In this case the switch T4 would be in an opened position, in order to prevent the transmitting electrode SE to be driven with an alternating signal.

It can be also advantageous to drive only the receiving electrode EE and the transmitting electrode SE with an alternating electrical signal in the second operation mode. In this case the switch T3 would be in an opened position. Further it can be advantageous to drive only the receiving electrode EE with an alternating electrical signal, which can be achieved by opening the switches T3 and T4. It can also be advantageous to drive all the electrodes SE, EE and KE with an alternating electrical signal in the second operation mode.

On which of electrodes EE, KE and SE an electrical alternating signal is applied, it ultimately depends from the specific case of application of the sensor device according to various embodiments.

Instead of the switches which are shown in FIG. 4b in order for the electrodes KE, SE and EE to be respectively exposed to the alternating electrical signals, a signal generator could be provided.

Seen that all the electrodes EE, KE and SE can be driven with an alternating electrical signal or only some of the electrodes EE, KE and SE can be driven with one alternating electrical signal, in the second operation mode it is possible to adapt the capacitive coupling between the electrodes EE, KE, SE and the field sensing electrodes FE by means of an approaching hand to a changing capacitive environment of an electric hand apparatus, for example a mobile phone. In case of a strong capacitive coupling with earth of the electric hand apparatus, it can be advantageous to drive an alternating electrical signal to all the three electrodes EE, KE and SE, in order to guarantee a sufficient capacitive coupling by means of the hand to the field sensing electrode FE or to the field sensing electrodes FE and to thus achieve a sufficient ample rise of the level of the signal S2 in case of an approach of a hand to the sensor device.

In a slight capacitive coupling of the sensor device to earth on the other hand it can be sufficient to drive only one or only two of the three electrodes EE, KE, SE with an alternating electrical signal. How many or which of the electrodes EE, KE, SE need to be charged with an electrical alternating signal, it can be for example determined in the first operation mode. Preferably this can be determined in the first operation mode, when the sensor device is not embraced by a hand, when the electric alternating field emitted to the transmitting electrode SE in the first operation mode is not coupled to the receiving electrode EE.

According to various embodiments the sensor device which is shown in FIG. 4a and FIG. 4b can be also operated with a first electrode structure, which comprises only one transmitting electrode SE and one receiving electrode EE, wherein the first electrode structure can be operated in a first operation mode and in a second operation mode. Here the second electrode structure shows at least one field sensing electrode FE. In the first operation mode, at the at least one receiving electrode EE, a first electric signal S1 can be picked up and the at least one transmitting electrode can be driven with a first alternating electrical signal WS1. In the second operating mode at least one of the electrodes EE, SE of the first electrode structure can be driven with an alternating electrical signal and at the at least one field sensing electrode FE, a second electric signal S2 can be picked up. Therewith in the second operation mode only the transmitting electrode SE or only the receiving electrode EE or both electrodes SE, EE can be driven with an alternating electrical signal. Which of the electrodes SE, EE are charged with an alternating electrical signal finally depends on the specific case of application of the capacitive sensor device.

According to various embodiments the electrode device of the capacitive sensor device which is shown in FIG. 4a and FIG. 4b can have a first electrode structure with at least one transmitting electrode SE, at least one receiving electrode EE and at least one compensation electrode KE, wherein the first electrode structure can be operated in a first operation mode and in a second operation mode. The electrode device shows moreover a second electrode structure with at least one field sensing electrode. In the first operation mode, at the at least one receiving electrode EE, a first electric signal can be picked up and at least one transmitting electrode SE can be driven with a first alternating electrical signal. Moreover in the first operation mode also the compensation electrode KE can be driven with a second alternating electrical signal WS2. In the second operation mode at least one of the electrodes EE, SE, KE of the first electrode structure can be driven with an alternating electrical signal.

According to various embodiments it is thus possible to drive only the transmitting electrode SE or only the receiving electrode EE or only the compensation electrode KE with an alternating electrical signal in the second operation mode. Alternatively the transmitting electrode SE and the receiving electrode EE can be driven with an alternating electrical signal in the second operation mode.

In a further embodiment only the compensation electrode KE and the receiving electrode EE can be driven with an alternating electrical signal in the second operation mode.

Furthermore in an embodiment only the transmitting electrode SE and the compensation electrode KE can be driven with an alternating electrical signal in the second operation mode. Finally it is possible to drive all the three electrodes SE, KE, EE with an alternating electrical signal in the second operation mode.

In this way the greatest possible degree of flexibility is achieved, so that in the second operation mode a different number of the electrodes EE, SE, KE of the first electrode structure can be driven with an alternating electrical signal depending on the specific requirements of the capacitive sensor device. This has in addition the advantage, that depending on the capacitive environment of the capacitive sensor device, only as many electrodes as necessary of the first electrode device must be driven with an alternating electrical signal, in order to ensure a sufficient capacitive coupling between the first electrode structure and the second electrode structure by means of a hand embracing the electric hand apparatus. In this way the capacitive sensor device can be optimized with respect to its energy consumption.

In the sensor devices which are shown in FIG. 4a and FIG. 4b, each compensation electrode is driven with an alternating electrical signal. However it can be advantageous to couple the compensation electrode KE with mass (ground or apparatus mass) in the first operating mode and/or in the second operation mode.

Figure 5:
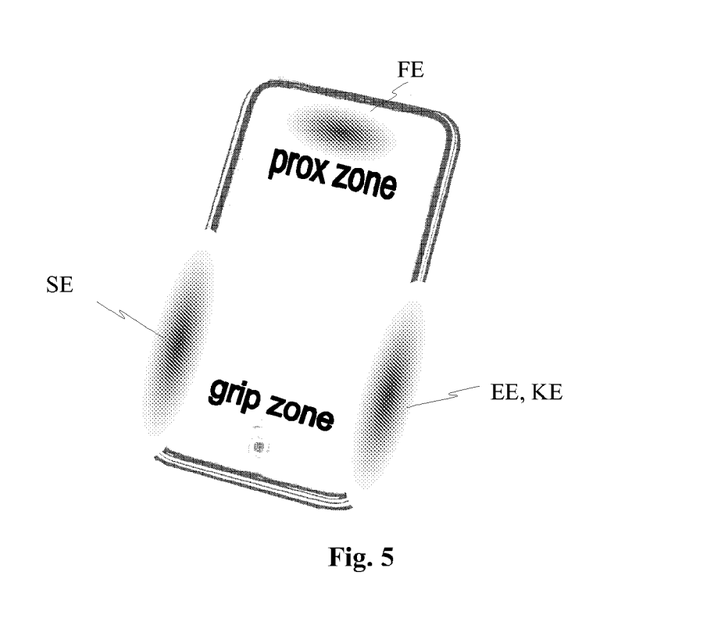
FIG. 5 an arrangement of the sensor electrodes of a sensor device according to various embodiments at an electric hand apparatus.
Figure 6A:
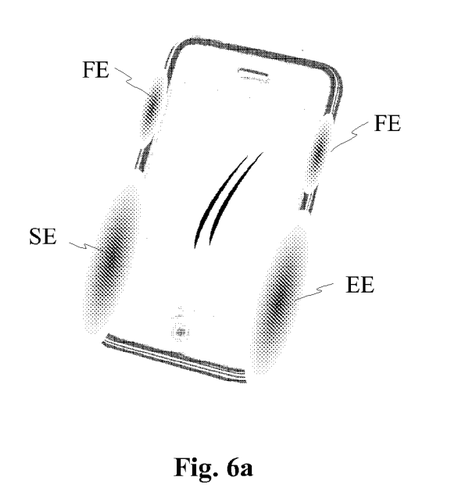
FIGS. 6a, 6b examples for an arrangement of the sensor electrodes of a sensor device according to various embodiments at an electric hand apparatus each with a different number of field sensing electrodes for the detection of an approach in the second operation mode.
Figure 6B:
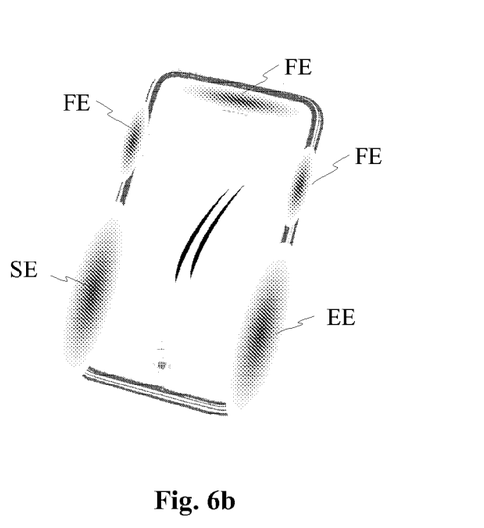

FIG. 5 typically shows an arrangement of the electrodes of a sensor device according to various embodiments at an electric hand apparatus, for example a mobile phone. In the lower area of the hand apparatus, on the left border area, the transmitting electrode SE is arranged and on the right border area, the receiving electrode EE is arranged and if necessary the compensation electrode KE. If now the electric hand apparatus in the lower area is embraced by a hand, the transmitting electrode SE and the receiving electrode EE are at least partially covered by the hand. By embracing the hand apparatus by a hand, a significant enlargement of the capacitive coupling between the transmitting electrode SE and the receiving electrode EE is achieved, which affects the field current flowing in the receiving electrode EE. The operation mode has been already described with reference to FIG. 1 and FIG. 3.

In the upper area of the electric hand apparatus, a field sensing electrode FE is arranged. The field sensing electrode FE is preferably arranged in such a way, that, in case of embracing the hand apparatus by a hand, the capacitive coupling between the transmitting electrode SE and the field sensing electrode FE is not substantially affected or not substantially improved. In the second operation mode if a second hand now approaches the field sensing electrode FE, the capacitive coupling between the electrodes SE, EE and the field sensing electrode FE significantly improves, which in turn affects the field current flowing in the field sensing electrode FE.

The lower area of the hand apparatus is designated here as "grip-area" and the upper area of the hand apparatus is designated "prox-area". A possible application scenarios of the electrode arrangement which is shown in FIG. 5 consists in the fact, that, in the case of a mobile phone, the embracing of the mobile phone can be detected by a hand and the approach of the mobile phone to the ear of the user, in which, for the approach of the mobile phone to the ear of the user, the sensor device is switched to the second operation mode, after having been detected an embracing of the mobile phone by a hand.

The detection signals DS1 or DS2 provided by the evaluating device can be then used for example in such a way that in case of an incoming call the ring of the mobile phone is stopped, as soon as the mobile phone is embraced by a hand and in such a way that the display lighting and/or the touch function of the mobile phone is automatically switched off, as soon as the mobile phone is held to the ear. In the same way an incoming call can be automatically received, when embracing the mobile phone or as soon as the mobile phone is held to the ear. Thus keys must be operated no longer in order to accept an incoming call. The ergonomics and the ease of use of the mobile phone can so clearly be improved. In particular, by the sensor device according to various embodiments, one achieves the result of an approach detection in the second operation mode which always has the same behavior regardless of the capacitive coupling of the sensor device to earth, i.e. the distance at which one activates an action which is assigned to the second threshold value, is always the same.

FIG. 6a and FIG. 6b show two more examples for the arrangement of the electrodes of a sensor device according to various embodiments at an electric hand apparatus.

In FIG. 6a, in the lower area of the hand apparatus the transmitting electrode SE and the receiving electrode EE and if necessary the compensation electrode KE are arranged. In the upper area of the hand apparatus on both sides field sensing electrodes FE are arranged.

In this example, the field sensing electrodes FE can be used as a replacement for conventional mechanical keys or switches. For example, the field sensing electrodes FE or the detection signal assigned to the field sensing electrodes FE can be linked to a telephone book function of a mobile phone. If a user now embraces the mobile phone with a hand and after embracing with the thumb it approaches for example to the right or the left field sensing electrode FE, the mobile phone can be automatically switched to the telephone book mode.

With the arrangement of the field sensing electrodes FE which is shown in FIG. 6b the precision of detection for an approach to the sensor device in the second operation mode can be increased even more, as the approach to the mobile phone can be detected in the second operation mode also independently, when a user approaches from right or from the left to the mobile phone.

The sensor device shown and described in the text can also be used, in order to transfer a hand apparatus, for example a mobile phone, when embracing the mobile phone, from a sleeping mode into an active mode. In this way the energy consumption of a mobile phone can clearly be reduced, being the mobile phone only in the active mode, when it is embraced in fact from a hand or when it is in use.

Above the sensor device has been explained more in detail relatively to the example of a mobile phone. The sensor device according to various embodiments can also be arranged in a computer mouse, a remote control, an input means for a game console, a mobile minicomputer, or similar. The sensor device according to various embodiments can also be provided for larger electric appliances, in which for example it is necessary to detect a contact of the device and subsequent to contact to detect another approach to the apparatus.

Therefore by means of various embodiments an electrode device for a capacitive sensor device is provided, comprising
 a first electrode structure with at least one transmitting electrode and at least one receiving electrode, wherein the first electrode structure can be operated in a first operation mode and in a second operation mode, and
 a second electrode structure with at least one field sensing electrode,
wherein
 in the first operation mode at the at least one receiving electrode, a first electric signal can be picked up and the at least one transmitting electrode can be driven with a first alternating electrical signal, and/or in the second operation mode at least one electrode of the first electrode structure can be driven with an alternating electrical signal and at the at least one field sensing electrode a second electric signal can be picked up.

In this way it is advantageously possible to use a capacitive sensor device both for the approach and the touch detection, in which another approach to the sensor device can be especially detected, after a touch of the sensor device has been detected. As the first electrode structure can be operated in a first operation mode and in a second operation mode, wherein the receiving electrode can be driven with an alternating signal in the second operation mode, the precision of detection of an approach can be substantially improved more in the second operation mode. The influence of a hand touching the sensor device can almost be eliminated for the detection of the approach. The precision of detection in addition can be advantageously adapted to the first electrode structure by selection of the electrodes, which are driven with an alternating signal.

The first electrode structure can additionally include at least one compensation electrode, in which in the first operation mode the at least one compensation electrode can be driven with a second alternating electrical signal, and/or in the second operation mode at least one electrode of the first electrode structure can be driven with the alternating electrical signal.

By providing the compensation electrode, in the first operation mode, the detection of embracing by a hand can be improved, whereas in the second operation mode, the detection of the approach can be improved when besides the transmitting electrode or the receiving electrode also the compensation electrode is driven with the alternating electrical signal. Alternatively one can drive all the electrodes of the first electrode structure or only some of the electrodes of the first electrode structure with the alternating electrical signal.

It is advantageous, when in the first operation mode a first electric alternating field emitted at the transmitting electrode can be coupled to the receiving electrode, and in the second operation mode a first electric alternating field emitted at the transmitting electrode and/or a second electric alternating field emitted at the receiving electrode and/or a third electric alternating field emitted at the compensation electrode can be coupled to the at least one field sensing electrode.

Depending on which electrodes of the first electrode structure is emitting an alternating electrical field, the detection accuracy and sensitivity in the second operation mode can be set.

The second alternating electrical signal is preferably selected in such a way, that in the first operation mode the electric alternating field emitted at the compensation electrode can be substantially coupled only to the receiving electrode.

Preferably, in the first operation mode, the second alternating electrical signal is dephased with respect to the first alternating electrical signal and it preferably shows a lower amplitude as the first alternating electrical signal. In this way one can ensure, that the electric alternating field emitted at the transmitting electrode in the first operation mode is not completely deleted by the electric alternating field emitted to the compensation electrode.

In the second operation mode the at least one compensation electrode can be driven with a fourth alternating electrical signal. In the second operation mode the at least one receiving electrode can be driven with a third alternating electrical signal.

In the second operation mode, the at least one transmitting electrode can be driven with the first alternating electrical signal, while in the second operation mode the second alternating electrical signal is substantially in phase with respect to the first alternating electrical signal.

Preferably, in the first operation mode the first electric signal which is picked up at the at least one receiving electrode, and/or in the second operation mode, the second electric signal which is picked up at the at least one field sensing electrode, are indicative for an approach of an object to the electrode device.

By means of various embodiments a circuit arrangement is further provided for a capacitive sensor device for the operation of an electrode device, especially an electrode device according to various embodiments, the circuit arrangement comprising an evaluating device, which can be coupled to the first electrode structure and to the second electrode structure, and at least one signal generation device, which can be coupled to the first electrode structure, wherein the evaluating device and the signal generation device can be operated in a first operation mode and in a second operation mode, in which in the first operation mode, a first electric signal which is picked up at the at least one receiving electrode can be fed to the evaluating device and it can be evaluated by the evaluating device, and the signal generation device generates a first alternating electrical signal, which can be driven at the at least one transmitting electrode, and/or in the second operation mode, the signal generation device generates an alternating electrical signal, which can be driven at least at one electrode of the first electrode structure, and a second electric signal which is picked up at the at least one field sensing electrode can be fed to the evaluating device and it can be evaluated by the evaluating device.

In the first operation mode, the signal generation device can generate a second alternating electrical signal, which can be driven to the at least one compensation electrode, and in the second operation mode, the signal generation device can generate an electrical alternating signal, which can be driven to at least one electrode of the first electrode structure.

A first threshold value can be assigned to the first operation mode, wherein the evaluating device and the signal generation device are configured to switch from the first operation mode to the second operation mode, as soon as the first electric signal exceeds the first threshold value. A second threshold value can be assigned to the second operation mode, wherein the evaluating device is configured to choose the second threshold value depending on the capacitive coupling between the transmission electrode and the receiving electrode in the first operation mode.

Preferably, the evaluating device can be intended to provide a first detection signal, as soon as the first electric signal exceeds the first threshold value, and/or to provide a second detection signal, as soon as the second electric signal exceeds the second threshold value.

The circuit arrangement can further include a phase shifter or an inverter in order to change the phasing of the second alternating electrical signal in the first operation mode.

According to further embodiments, a method is provided for the approach and touch detection, comprising at least the following steps in a first operation mode
evaluating a first electric signal which is picked up on at least one receiving electrode,
driving at least one transmitting electrode with a first alternating electrical signal, and/or
in a second operation mode
driving at least one electrode of a first electrode structure with an alternating electrical signal, and/or
evaluating a second electric signal which is picked up at the at least one field sensing electrode.

The method can further comprise the following steps
in a first operation mode, driving at least one compensation electrode with a second alternating electrical signal, and/or
in a second operation mode, driving at least one electrode of the first electrode structure with an alternating electrical signal.

It is advantageous to drive at least two electrodes of the first electrode structure with an alternating electrical signal in the second operation mode. It can be fairly advantageous, that all the electrodes of the first electrode structure are driven with an alternating electrical signal in the second operation mode.

A sensor device is also provided, comprising at least one transmitting electrode, at least one receiving electrode and at least one field sensing electrode, wherein the receiving electrode can be operated in a first operation mode and in a second operation mode. The sensor device moreover comprises an evaluating device, which is coupled with the transmitting electrode, the receiving electrode and the field sensing electrode. The evaluating device is intended to drive the transmitting electrode with a first alternating electrical signal, to evaluate in the first operation mode a first electric signal which is picked up at the receiving electrode, and to drive the receiving electrode with a second alternating electrical signal in the second operation mode, and to evaluate a second electric signal which is picked up at the receiving electrode. In the first operation mode, a first alternating electric field emitted at the transmitting electrode can be coupled to the receiving electrode and to the field sensing electrode. In the second operation mode, a first alternating electric field emitted at the transmitting electrode and a second electric alternating field emitted at the receiving electrode can be coupled to the field sensing electrode.

In this way it is advantageously possible to use a capacitive sensor device both for the detection of an approach and a touch, in which especially another approach to the sensor device can be detected, after a touch of the sensor device has been detected. As the receiving electrode can be operated in a first operation mode and in a second operation mode, wherein the receiving electrode is driven with an alternating signal in the second operation mode, the precision of the detection of an approach can be substantially improved in the second operation mode.

In the first operation mode, the first electric signal which is picked up at the receiving electrode can be indicative for an approach of an object to the sensor device. In the second operation mode the second electric signal which is picked up at the field sensing electrode can be indicative for an approach of an object to the sensor device.

It is particularly advantageous to assign a first threshold value to the first operation mode and to design the evaluating device in such a way, that it can change from the first operation mode to the second operation mode, as soon as the first electric signal exceeds the first threshold value.

A second threshold value can be assigned to the second operation mode, wherein the evaluating device can be configured to choose the second threshold value according to the first threshold value. Thus one advantageously achieves the result relative to the fact that the second threshold value, whose exceeding can cause for example an action in an electric hand apparatus, corresponds to a situation in which the sensor device is substantially always at the same distance from an object. This means, that the second threshold value is always selected in such a way, that the action assigned to the threshold value is always triggered at the same distance of an object approaching to the sensor device.

The evaluating device is advantageously configured to provide a first detection signal, as soon as the first electric signal exceeds the first threshold value, and to provide a second detection signal, as soon as the second electric signal exceeds the second threshold value.

Furthermore the sensor device can have a compensation electrode, which can be coupled to the evaluating device. The evaluating device can be intended to drive the compensation electrode with a third alternating electrical signal in the first operation mode, wherein the phase and/or the amplitude of the third alternating electrical signal is different from the phase and/or from the amplitude of the first electric switching signal.

Advantageously, the compensation electrode, the receiving electrode and the field sensing electrode are arranged relative to each other, so that an electric alternating field emitted at the compensation electrode can be substantially only coupled to the receiving electrode. With the help of the alternating electric field emitted at the compensation electrode the sensitivity of the sensor device in the first operation mode can be set.

By means of various embodiments a method for the approach and touch detection is also provided with a sensor device according to various embodiments, wherein the transmitting electrode is driven with a first alternating electrical signal, so that a first alternating electric field is emitted at the transmitting electrode, which can be coupled to the receiving electrode and to the field sensing electrode, in which a first electric signal which is picked up at the receiving electrode is evaluated in the first operation mode, and in which in the second operation mode the receiving electrode is driven with a second alternating electrical signal, so that a second alternating electric field is emitted at the receiving electrode, which can be coupled to the field sensing electrode, and a second electric signal which is picked up at the field sensing electrode is evaluated.

A first threshold value, which is indicative for a touch of the sensor device by an object, can be assigned to the first operation mode, wherein the sensor device changes from the first operation mode to the second operation mode, as soon as the first electric signal exceeds the first threshold value. A second threshold value, which is indicative for an approach of the object to the sensor device, can be as signed to the second operation mode, in which the second threshold value is selected according to the first threshold value.

In the first operation mode, the compensation electrode can be driven with a third alternating electrical signal, wherein the phase and/or the amplitude of the third alternating electrical signal is different from the phase and/or the amplitude of the first electric switching signal.

What is claimed is:
1. A capacitive sensor device, comprising
a first electrode structure with at least one transmitting electrode and at least one receiving electrode,
a second electrode structure with at least one field sensing electrode, and an evaluating device coupled with the first and second electrode structure and configured to operate in a first or a second operation mode, wherein in the first operation mode, the evaluating device controls the first and second electrode structure such that the at least one transmitting electrode receives a first alternating electrical signal and the evaluating device receives a first electric signal can be tapped from the at least one receiving electrode, and in the second operation mode, the evaluating device controls the first and second electrode structure such that the at least one transmitting electrode and the at least one receiving electrode of the first electrode structure each receive an alternating electrical signal and the evaluating device receives a second electric signal from the at least one field sensing electrode.

2. The capacitive sensor device according to claim 1, wherein the evaluating device uses a variable threshold value when evaluating the first or second electric signal, and wherein the evaluating device is configured to switch from the first operation mode to the second operation mode based on the variable threshold.

3. The capacitive sensor device according to claim 2, wherein when operating in the first operation mode, the evaluating device is configured to change from the first operation mode to the second operation mode, as soon as the first electric signal exceeds or falls below a first threshold value.

4. The capacitive sensor device according to claim 2, wherein when operating in the second operation mode, the evaluating device is configured to select a second threshold value.

5. The capacitive sensor device according to claim 4, wherein the evaluating device is configured to provide a first detection signal, as soon as the first electric signal exceeds or falls below the first threshold value, and to provide a second detection signal, as soon as the second electric signal exceeds or falls below the second threshold value.

6. The capacitive sensor device according to claim 2, when operating in the first operation mode, the evaluating device uses a first threshold value and when operating in the second operation mode, the evaluating device uses a second threshold value.

7. The capacitive sensor device according to claim 1, wherein the first electrode structure additionally comprises at least one compensation electrode.

8. The capacitive sensor device according to claim 7, wherein in the first operation mode, the at least one compensation electrode is configured to receive a second alternating electrical signal, and in the second operation mode, at least one electrode of the first electrode structure is configured to receive the alternating electrical signal.

9. The capacitive sensor device according to claim 7, wherein in the first operation mode, a first alternating electric field emitted at the transmitting electrode is coupled to the receiving electrode, and in the second operation mode, a first alternating electric field emitted at the transmitting electrode and/or a second alternating electric field emitted at the receiving electrode and/or a third alternating electric field emitted at the compensation electrode is coupled to the at least one field sensing electrode.

10. The capacitive sensor device according to claim 7, wherein the second alternating electrical signal is selected in such a way, that, in the first operation mode, an alternating electric field emitted at the compensation electrode is substantially coupled only to the receiving electrode.

11. The capacitive sensor device according to claim 7, wherein the compensation electrode, the receiving electrode and the field sensing electrode are arranged relative to each other, in such a way that an alternating electric field emitted at the compensation electrode is substantially coupled only to the receiving electrode.

12. The capacitive sensor device according to claim 1, wherein the second alternating electrical signal is dephased with respect to the first alternating electrical signal and/or has a lower amplitude with respect to the first alternating electrical signal.

13. The capacitive sensor device according to claim 7, wherein the second alternating electrical signal is in phase with the first alternating electrical signal.

14. The capacitive sensor device according to claim 7, wherein in the second operation mode the at least one compensation electrode is configured to receive a fourth alternating electrical signal.

15. The capacitive sensor device according to claim 7, wherein in the second operation mode the at least one transmitting electrode is configured to receive the first alternating electrical signal, wherein in the second operation mode the third electric alternating signal is substantially in phase with the first alternating electrical signal.

16. The capacitive sensor device according to claim 7, wherein the at least one compensation electrode, in the first operation mode and/or in the second operation mode is coupled to mass.

17. The capacitive sensor device according to claim 1, wherein in the second operation mode the at least one receiving electrode is configured to receive a third electric alternating signal.

18. A handheld device comprising:

a first electrode structure with at least one transmitting electrode and at least one receiving electrode, a second electrode structure with at least one field sensing electrode;

an evaluating device, which is coupleable with the first electrode structure and with the second electrode structure, and at least one signal generation device, which is coupleable with electrodes of the first electrode structure, wherein the evaluating device and the signal generation arrangement can be operated in a first operation mode or in a second operation mode, wherein in the first operation mode a first electric signal which received from the at least one receiving electrode is fed to the evaluating device and evaluated by the evaluating device, wherein the signal generation device generates a first alternating electrical signal, which is fed to the at least one transmitting electrode, in the second operation mode the signal generation device generates an alternating electrical signal, which is supplied at least to one electrode of the first electrode structure, and a second electric signal which received from the at least one field sensing electrode is fed to the evaluating device and it can be evaluated by the evaluating device.

19. The handheld device according to claim 18, wherein in the first operation mode the signal generation device generates a second alternating electrical signal, which can be supplied at the at least one compensation electrode and wherein in the second operation mode the signal generation device generates an alternating electrical signal, which can be supplied to at least one electrode of the first electrode structure.

20. The handheld device according to claim 19, wherein the evaluating device is configured to choose the second threshold value depending on the capacitive coupling between the compensation electrode and the receiving electrode.

21. The handheld device according to claim 18, wherein a first threshold value can be assigned to the first operation mode and wherein the evaluating device and the signal generation device are configured to change from the first operation mode to the second operation mode, as soon as the first electric signal exceeds or falls below the first threshold value.

22. The handheld device according to claim 18, wherein a second threshold value can be assigned to the second operation mode, and wherein the evaluating device is configured to choose the second threshold value depending on the capacitive coupling between the transmission electrode and the receiving electrode in the first mode of operation.

23. The handheld device according to claim 18, wherein the evaluating device is configured
- to provide a first detection signal, as soon as the first electric signal exceeds or falls below the first threshold value, and
- to provide a second detection signal, as soon as the second electric signal exceeds or falls below the second threshold value.

24. The handheld device according to claim 18, further comprising a phase shifter or an inverter to change the phase of the second alternating electrical signal in the first operation mode.

* * * * *

UNITED STATES PATENT AND TRADEMARK OFFICE
CERTIFICATE OF CORRECTION

| | | |
|---|---|---|
| PATENT NO. | : 9,166,581 B2 | Page 1 of 1 |
| APPLICATION NO. | : 13/637131 | |
| DATED | : October 20, 2015 | |
| INVENTOR(S) | : Kaltner et al. | |

It is certified that error appears in the above-identified patent and that said Letters Patent is hereby corrected as shown below:

Claims,
Column 21,
Claim 1, line 8, delete "…first electric signal can be tapped from the at least one receiving electrode, …" insert --…first electric signal from the at least one receiving electrode,…--

Signed and Sealed this
Fifth Day of April, 2016

Michelle K. Lee
*Director of the United States Patent and Trademark Office*